(12) United States Patent
Zhu

(10) Patent No.: US 10,516,067 B2
(45) Date of Patent: Dec. 24, 2019

(54) LOW-WARPAGE BACKSIDE ALUMINUM PASTE FOR CRYSTALLINE SILICON SOLAR CELLS

(71) Applicant: NANTONG T-SUN NEW ENERGY CO., LTD., Nantong, Jiangsu (CN)

(72) Inventor: Peng Zhu, Jiangsu (CN)

(73) Assignee: NANTONG T-SUN NEW ENERGY CO., LTD., Nantong, Jiangsu (CN)

( * ) Notice: Subject to any disclaimer, the term of this patent is extended or adjusted under 35 U.S.C. 154(b) by 134 days.

(21) Appl. No.: 15/571,439

(22) PCT Filed: Apr. 13, 2017

(86) PCT No.: PCT/CN2017/080436
§ 371 (c)(1),
(2) Date: Nov. 2, 2017

(87) PCT Pub. No.: WO2018/040571
PCT Pub. Date: Mar. 8, 2018

(65) Prior Publication Data
US 2019/0157477 A1    May 23, 2019

(30) Foreign Application Priority Data
Aug. 30, 2016 (CN) .......................... 2016 1 0752361

(51) Int. Cl.
*H01L 31/0224*    (2006.01)
*H01B 1/22*    (2006.01)
*H01B 1/02*    (2006.01)

(52) U.S. Cl.
CPC ..... *H01L 31/022441* (2013.01); *H01B 1/023* (2013.01); *H01B 1/22* (2013.01); *H01L 31/0224* (2013.01); *H01L 31/022425* (2013.01)

(58) Field of Classification Search
CPC ...... H01B 1/22; H01B 1/16; H01L 31/022425
USPC ........................ 136/256; 252/182.1; 438/98
See application file for complete search history.

(56) References Cited

U.S. PATENT DOCUMENTS

| 2009/0229665 | A1 | 9/2009 | Young et al. | |
| 2010/0059116 | A1* | 3/2010 | Brenner | H01B 1/16 136/256 |
| 2012/0178207 | A1* | 7/2012 | Jiang | H01L 31/022425 438/98 |
| 2012/0325307 | A1* | 12/2012 | Li | H01B 1/22 136/256 |

FOREIGN PATENT DOCUMENTS

| CN | 102142467 A | 8/2011 |
| CN | 102324267 A | 1/2012 |
| CN | 105440879 A | 3/2016 |
| CN | 106158072 A | 11/2016 |

OTHER PUBLICATIONS

International Search Report and Written Opinion of PCT/CN2017/080436 dated Apr. 13, 2017 (Chinese).

* cited by examiner

*Primary Examiner* — Khanh T Nguyen
(74) *Attorney, Agent, or Firm* — Rankin, Hill & Clark LLP

(57) ABSTRACT

The present invention discloses a low-warpage backside aluminum paste used for crystalline silicon solar cells, comprising 85-95 parts by weight of aluminum powder, 0.1-0.5 part by weight of glass powder, 4-13 parts by weight of organic carrier and 0.6-2 parts by weight of additive. The thermal expansion coefficient of the aluminum pastes is effectively reduced by the use of glass powders with larger particle sizes. In addition, high content of aluminum powder in the paste formula results in a reduced printing wet weight, a high aluminum content in the back surface electric field, and thus, a reduced solar cell warpage without detriment to the performance of the solar cells.

11 Claims, No Drawings

LOW-WARPAGE BACKSIDE ALUMINUM PASTE FOR CRYSTALLINE SILICON SOLAR CELLS

FIELD OF THE INVENTION

The invention relates to the field of solar cells, and more particularly, to a low warpage backside aluminum paste for crystalline silicon solar cells.

BACKGROUND OF THE INVENTION

Silicon solar cells are devices for converting solar energy directly into electrical energy by means of photovoltaic effect. The aluminum paste used for silicon solar cells is a main member of the solar electronic pastes. In the manufacturing process of solar cells, the aluminum paste is usually printed on the backside of silicon wafers by means of screen printing, and aluminum is diffused into the silicon matrix to form a heavily doped P+ layer (i.e., a back surface electric field) after drying, sintering and cooling processes. Under the effect of the back surface electric field, electrons are pushed away from the back surface, and thus the recombination of electrons and holes is reduced, resulting in an increased open circuit voltage.

Furthermore, a mirror-like surface is formed at the backside of the solar cell after aluminum powder is sintered, which reflects sunlight unabsorbed by the solar cell back into the inside of the solar cell, resulting in an increase in the probability of photon absorption by the solar cell, and thus an increase in the short-circuit current of the solar cell. Therefore, the performance and properties of aluminum pastes are of vital importance for improving the photoelectric characteristics of solar cells.

Nowadays for the research and development of the backside aluminum paste, it is worth considering for skilled persons in the art to reduce the warpage of the silicon wafers in solar cells, besides to improve the photoelectric conversion efficiency of solar cells. Most surface of a silicon wafer is covered by the backside aluminum paste. During the sintering-cooling period, the shrinkage of the aluminum-silicon moiety is far greater than that of silicon moiety, since the linear thermal expansion coefficient of aluminum-silicon is far greater than that of silicon. Accordingly, the surface of the silicon wafer withstands a compressive stress, and thus, a warpage emerges. In addition, in order to reduce raw material costs, thickness decrease of silicon wafers is becoming more obvious. The warpage is more serious for the silicon wafers with thinner thickness.

In order to reduce the warping phenomenon, Chinese Patent Application No. 201010264080.3 disclosed a method wherein a coarse aluminum powder with a particle size of 6-8 μm and a fine aluminum powder with a particle size of 3-5 μm were used together, so as to reduce the stress generated in the sintering process, and thus to achieve a low warpage. However, the space generated by the expansion of the fine aluminum powder is limited, and thus the decrease of warpage is limited.

SUMMARY OF THE INVENTION

The object of the present invention is to provide a low warpage backside aluminum paste for crystalline silicon solar cells.

A low warpage backside aluminum paste for crystalline silicon solar cells disclosed in the invention comprises 85-95 parts by weight of aluminum powder, 0.1-0.5 part by weight of glass powder, 4-13 parts by weight of organic carriers and 0.6-2 parts of additives.

Preferably, the aluminum powder is a high oxygen nanosized aluminum fiber with a 0.6%-0.8% oxygen content.

Preferably, the particle size of the glass powder D50 is 10-15 μm.

Preferably, the organic carrier comprises: 4-10 parts by weight of ethyl cellulose, 2-8 parts by weight of nitrocellulose, 0.5-3 parts by weight of polyamide modified phenolic resin, 4-7 parts by weight of epoxy modified phenolic resin, 35-45 parts by weight of terpinol, 3-10 parts by weight of carbitol acetate and 25-40 parts by weight of ethylene glycol.

Preferably, the viscosity of the paste after being grinded by a three-roller grinder is within 10-20 Pa·s.

Beneficial Effects: As compared with the existing technologies in the art, on the one hand, the aluminum paste of the invention has a relatively high aluminum powder content; on the other hand, the thermal expansion coefficient of the aluminum paste disclosed in the invention is small, since the glass powder with a relatively large particle size are used and the content of the glass powder is low. Meanwhile, the viscosity of the aluminum paste after being grinded by a three-roller grinder is in the range of 10 to 20 Pa·s. Therefore, even if the printing wet weight is reduced, the aluminum content in the back surface electric field can be guaranteed, so as to lower the warpage of the solar cell, but not to affect the performance of the solar cell.

DETAILED DESCRIPTION OF THE PREFERRED EMBODIMENTS

The present invention is described in detail with specific embodiments. The following embodiments are intended only to more clearly illustrate the technical schemes of the invention, and not to limit the scope of the invention.

Embodiment 1

(1). Aluminum powder used is a nanosized aluminum fiber with an oxygen content of 0.6%.

(2). Glass powder with a particle size D50 of 10 μm is used.

(3). Organic carrier consisting of 7.5 parts by weight of ethyl cellulose, 8 parts by weight of nitrocellulose, 2.5 parts by weight of polyamide modified phenolic resin, 4 parts by weight of epoxy modified phenolic resin, 39 parts by weight of terpineol, 3 parts by weight of carbitol, 36 parts by weight of ethylene glycol is used.

(4). 85 parts by weight of aluminum powder, 0.4 part by weight of glass powder, 13 parts by weight of organic carrier, 1.6 parts by weight of additives are mixed, and then the mixture is grinded to a fineness less than 20 μm, and a viscosity around 15 Pa·s with a three roller grinding machine. The printing wet weight used is 1.0 g, and a low-warpage all-aluminum back surface field with a sheet resistivity less than 60 mΩ is obtained.

Embodiment 2

(1). Aluminum powder used is a nanosized aluminum fiber with an oxygen content of 0.6%.

(2). Glass powder with a particle size D50 of 14 μm is used.

(3). Organic carrier consisting of 10 parts by weight of ethyl cellulose, 6 parts by weight of nitrocellulose, 1 part by weight of polyamide modified phenolic resin, 6 parts by weight of epoxy modified phenolic resin, 40 parts by weight of terpineol, 10 parts by weight of carbitol, 28 parts by weight of ethylene glycol is used.

(4). 95 parts by weight of aluminum powder, 0.4 part by weight of glass powder, 4 parts by weight of organic carrier, 0.6 part by weight of additives are mixed, and then the mixture is grinded to a fineness less than 20 μm, and a viscosity around 10 Pa·s with a three roller grinding machine. The printing wet weight used is 1.0 g, and a low-warpage all-aluminum back surface field with a sheet resistivity less than 60 mΩ is obtained.

Embodiment 3

(1). Aluminum powder used is a nanosized aluminum fiber with an oxygen content of 0.7%.

(2). Glass powder with a particle size D50 of 15 μm is used.

(3). Organic carrier consisting of 10 parts by weight of ethyl cellulose, 3 parts by weight of nitrocellulose, 1.5 parts by weight of polyamide modified phenolic resin, 7 parts by weight of epoxy modified phenolic resin, 45 parts by weight of terpineol, 8.5 parts by weight of carbitol, 25 parts by weight of ethylene glycol is used.

(4). 92 parts by weight of aluminum powder, 0.5 part by weight of glass powder, 6 parts by weight of organic carrier, 1.5 parts by weight of additives are mixed, and then the mixture is grinded to a fineness less than 20 μm, and a viscosity around 14 Pa·s with a three roller grinding machine. The printing wet weight used is 1.0 g, and a low-warpage all-aluminum back surface field with a sheet resistivity less than 60 mΩ is obtained.

Embodiment 4

(1). Aluminum powder used is a nanosized aluminum fiber with an oxygen content of 0.7%.

(2). Glass powder with a particle size D50 of 13 μm is used.

(3). Organic carrier consisting of 8 parts by weight of ethyl cellulose, 2 parts by weight of nitrocellulose, 0.5 part by weight of polyamide modified phenolic resin, 5 parts by weight of epoxy modified phenolic resin, 35 parts by weight of terpineol, 9.5 parts by weight of carbitol, 40 parts by weight of ethylene glycol is used.

(4). 89 parts by weight of aluminum powder, 0.1 part by weight of glass powder, 9.9 parts by weight of organic carrier, 1 part by weight of additives are mixed, and then the mixture is grinded to a fineness less than 20 μm, and a viscosity around 18 Pa·s with a three roller grinding machine. The printing wet weight used is 1.0 g, and a low-warpage all-aluminum back surface field with a sheet resistivity less than 60 mΩ is obtained.

Embodiment 5

(1). Aluminum powder used is a nanosized Aluminum fiber with an oxygen content of 0.8%.

(2). Glass powder with a particle size D50 of 14 μm is used.

(3). Organic carrier consisting of 4 parts by weight of ethyl cellulose, 4 parts by weight of nitrocellulose, 2 parts by weight of polyamide modified phenolic resin, 4 parts by weight of epoxy modified phenolic resin, 40 parts by weight of terpineol, 10 parts by weight of carbitol, 35 parts by weight of ethylene glycol is used.

(4). 87 parts by weight of aluminum powder, 0.2 part by weight of glass powder, 10.8 parts by weight of organic carrier, 2 parts by weight of additives are mixed, and then the mixture is grinded to a fineness less than 20 μm, and a viscosity around 20 Pa·s with a three roller grinding machine. The printing wet weight used is 1.0 g, and a low-warpage all-aluminum back surface field with a sheet resistivity less than 60 mΩ is obtained.

The major properties of the aluminum pastes of Embodiments 1-5 are shown in Table 1.

TABLE 1

Properties of the aluminum pastes of Embodiments 1-5

| | The Paste | | | | |
|---|---|---|---|---|---|
| | Embodiment 1 | Embodiment 2 | Embodiment 3 | Embodiment 4 | Embodiment 5 |
| Contact Resistance/Ω | 7 | 6 | 4 | 7 | 5 |
| Warpage/mm | 0.4 | 0.5 | 0.3 | 0.4 | 0.5 |

It can be seen from Table 1 that the warpage of silicon wafers is effectively reduced while the electrical conductivity is not be affected, by using large-particle-size glass powders with a small thermal expansion coefficient and by raising the content of aluminum powder in the aluminum paste.

The invention is not limited to the above preferred embodiments. Various other products made with the identical or similar technologies disclosed in the invention by persons skilled in the art who are enlightened from the invention, no matter any modifications or changes in shape or structure, are within the scope of the invention.

I claim:

1. A low-warpage backside aluminum paste for crystalline silicon solar cells comprising 87-95 parts by weight of aluminum powder, 0.1-0.5 part by weight of glass powder: 4-13 parts of organic carrier and 0.6-2 parts of additive,
wherein the organic carrier comprises 4-10 parts by weight of ethyl cellulose, 2-8 parts by weight of nitrocellulose, 0.5-3 parts by weight of polyamide modified phenolic resin, 4-7 parts by weight of epoxy modified phenolic resin, 35-45 parts by weight of terpinol, 3-10 parts by weight of carbitol acetate and 25-40 parts by weight of ethylene glycol.

2. The paste according to claim 1, wherein the aluminum powder is a high oxygen nanosized aluminum fiber with a 0.6% to 0.8% oxygen content.

3. The paste according to claim 1, wherein the particle size of the glass powder D50 is 10-15 μm.

4. The paste according to claim 1, wherein the viscosity the paste after being grinded by a three-roller grinder is with 10-20 Pa·s.

5. A low-warpage backside aluminum paste for crystalline silicon solar cells comprising 85-95 parts by weight of aluminum powder, 0.1-0.5 part by weight of glass powder, 4-13 parts of organic carrier and 0.6-2 parts of additive,
wherein the viscosity of the paste after being grinded by a three-roller grinder is with 10-18 Pa·s, and
the organic carrier comprises 4-10 parts by weight of ethyl cellulose, 2-8 parts by weight of nitrocellulose, 0.5-3 parts by weight of polyamide modified phenolic resin, 4-7 parts by weight of epoxy modified phenolic resin, 35-45 parts by weight of terpinol, 3-10 parts by weight of carbitol acetate and 25-40 parts by weight of ethylene glycol.

6. The paste according to claim 5, wherein, the aluminum powder is a high oxygen nanosized aluminum fiber with a 0.6% to 0.8% oxygen content.

7. The paste according to 5, wherein the particle size of the glass powder D50 is 10-15 μm.

8. A low-warpage backside aluminum paste for crystalline silicon solar cells comprising 85-95 parts by weight of aluminum powder, 0.1-0.5 part by weight of glass powder, 4-13 parts of organic carrier and 0.6-2 parts of additive, wherein the organic carrier comprises 4-10 parts by weight of ethyl cellulose, 2-8 parts by weight of nitrocellulose, 0.5-3 parts by weight of polyimide modified phenolic resin, 4-7 parts by weight of epoxy modified phenolic resin, 35-45 parts by weight of terpinol, 3-10 parts by weight of carbitol acetate and 25-40 parts by weight of ethylene glycol.

9. The paste according to claim 8, wherein the aluminum powder is a high oxygen nanosized aluminum fiber with a 0.6% to 0.8% oxygen content.

10. The paste according to claim 8, wherein the particle size of the glass powder D50 is 10-15 μm.

11. The paste according to claim 8, wherein the viscosity of the paste after being grinded by a three-roller grinder is with 10-20 Pa·s.

* * * * *